United States Patent
Kesler

(10) Patent No.: US 11,870,217 B2
(45) Date of Patent: Jan. 9, 2024

(54) BI-DIRECTIONAL VERTICAL CAVITY SURFACE EMITTING LASERS

(71) Applicant: Lumentum Operations LLC, San Jose, CA (US)

(72) Inventor: Benjamin Kesler, Sunnyvale, CA (US)

(73) Assignee: Lumentum Operations LLC, San Jose, CA (US)

( * ) Notice: Subject to any disclaimer, the term of this patent is extended or adjusted under 35 U.S.C. 154(b) by 26 days.

(21) Appl. No.: 17/453,057

(22) Filed: Nov. 1, 2021

(65) Prior Publication Data

US 2023/0108210 A1 Apr. 6, 2023

Related U.S. Application Data

(60) Provisional application No. 63/261,697, filed on Sep. 27, 2021, provisional application No. 63/261,699, filed on Sep. 27, 2021.

(51) Int. Cl.
| | |
|---|---|
| *H01S 5/00* | (2006.01) |
| *H01S 5/183* | (2006.01) |
| *H01S 5/34* | (2006.01) |
| *H01S 5/42* | (2006.01) |
| *H01S 5/30* | (2006.01) |
| *H01S 5/20* | (2006.01) |

(52) U.S. Cl.
CPC ...... *H01S 5/18397* (2013.01); *H01S 5/18305* (2013.01); *H01S 5/18313* (2013.01); *H01S 5/18388* (2013.01); *H01S 5/2081* (2013.01); *H01S 5/3095* (2013.01); *H01S 5/3416* (2013.01); *H01S 5/426* (2013.01); *H01S 5/183* (2013.01); *H01S 5/18394* (2013.01)

(58) Field of Classification Search
CPC ............ H01S 5/18397; H01S 5/18305; H01S 5/18313; H01S 5/18388; H01S 5/2081; H01S 5/3095; H01S 5/3416; H01S 5/426; H01S 5/183; H01S 5/18394
See application file for complete search history.

(56) References Cited

U.S. PATENT DOCUMENTS

| | | | |
|---|---|---|---|
| 5,754,578 A | 5/1998 | Jayaraman | |
| 5,892,787 A | 4/1999 | Tan et al. | |
| 5,914,976 A * | 6/1999 | Jayaraman | ............ H01S 5/0262 372/50.21 |

(Continued)

OTHER PUBLICATIONS

Harris et al., "Emerging application for vertical cavity surface emitting lasers," Semicond. Sci. Technology, vol. 26, 2011, 11 Pages.

*Primary Examiner* — Kinam Park
(74) *Attorney, Agent, or Firm* — Harrity & Harrity, LLP

(57) ABSTRACT

In some implementations, a vertical cavity surface emitting laser (VCSEL) device includes a substrate layer and a first set of epitaxial layers for a bottom-emitting VCSEL disposed on the substrate layer. The first set of epitaxial layers may include a first set of mirrors and at least one first active layer. The VCSEL device may include a second set of epitaxial layers for a top-emitting VCSEL disposed on the first set of epitaxial layers for the bottom-emitting VCSEL. The second set of epitaxial layers may include a second set of mirrors and at least one second active layer. The top-emitting VCSEL and the bottom-emitting VCSEL may be configured to emit light in opposite light emission directions.

20 Claims, 6 Drawing Sheets

(56) References Cited

U.S. PATENT DOCUMENTS

| | | | |
|---|---|---|---|
| 6,222,206 B1* | 4/2001 | Chirovsky | H01S 5/18305 |
| | | | 324/71.5 |
| 6,493,372 B1 | 12/2002 | Boucart et al. | |
| 6,583,445 B1* | 6/2003 | Reedy | H01L 31/101 |
| | | | 372/50.1 |
| 6,608,846 B1 | 8/2003 | Fischer et al. | |
| 10,120,149 B1 | 11/2018 | Mathai et al. | |
| 2002/0075929 A1 | 6/2002 | Cunningham | |
| 2002/0093024 A1* | 7/2002 | Lee | H01S 5/18388 |
| | | | 257/98 |
| 2002/0094589 A1* | 7/2002 | Chirovsky | H01S 5/18305 |
| | | | 438/28 |
| 2004/0096996 A1 | 5/2004 | Cheng et al. | |
| 2005/0025211 A1 | 2/2005 | Zhang et al. | |
| 2008/0013329 A1 | 1/2008 | Takeda et al. | |
| 2009/0285253 A1 | 11/2009 | Masui et al. | |
| 2013/0034117 A1* | 2/2013 | Hibbs-Brenner | H01S 5/18336 |
| | | | 372/45.01 |
| 2016/0254638 A1* | 9/2016 | Chen | H04N 13/254 |
| | | | 362/11 |
| 2018/0212404 A1 | 7/2018 | Enzmann et al. | |
| 2019/0199063 A1* | 6/2019 | Barve | H01S 5/18311 |
| 2020/0328574 A1 | 10/2020 | Pai | |

\* cited by examiner

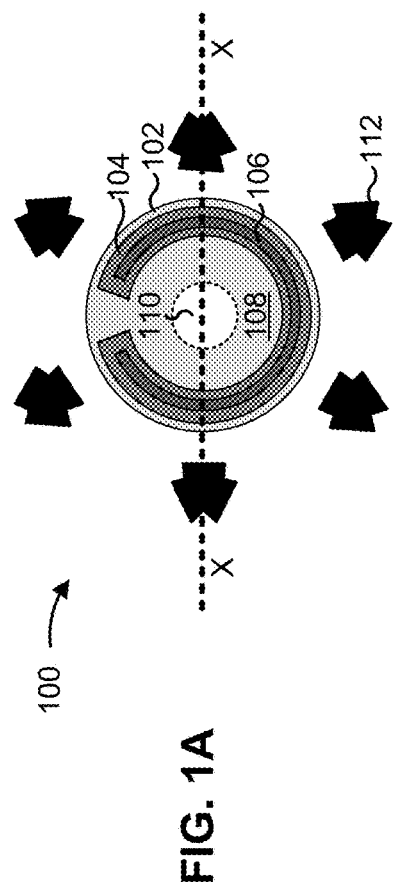
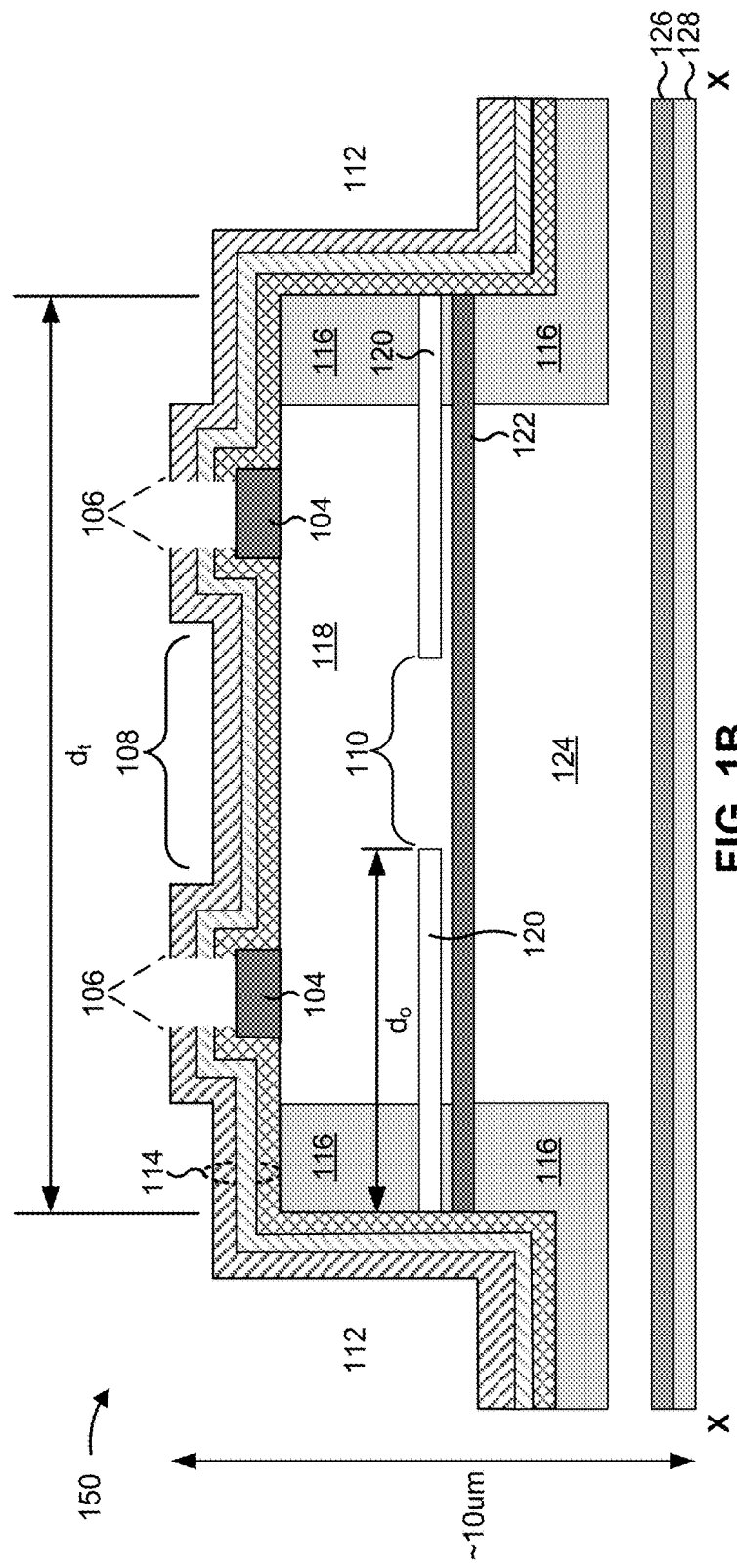
FIG. 1A
FIG. 1B

BI-DIRECTIONAL VERTICAL CAVITY SURFACE EMITTING LASERS

CROSS-REFERENCE TO RELATED APPLICATION

This Patent Applications claims priority to U.S. Provisional Patent Application No. 63/261,697, filed on Sep. 27, 2021, and entitled "VERTICALLY-OFFSET SINGLE-SUBSTRATE SINGLE-CHIP VERTICAL CAVITY SURFACE EMITTING LASERS." This Patent Application also claims priority to U.S. Provisional Patent Application No. 63/261,699, filed on Sep. 27, 2021, and entitled "BI-DIRECTIONAL VERTICAL CAVITY SURFACE EMITTING LASER CHIP." The disclosures of the prior Applications are considered part of and are incorporated by reference into this Patent Application.

TECHNICAL FIELD

The present disclosure relates generally to lasers and to bi-directional vertical cavity surface emitting lasers (VCSELs).

BACKGROUND

A vertical-emitting device, such as a vertical cavity surface emitting laser (VCSEL), may include a laser, an optical transmitter, and/or the like in which a beam is emitted in a direction perpendicular to a surface of a substrate (e.g., vertically from a surface of a semiconductor wafer). Multiple vertical-emitting devices may be arranged in one or more emitter arrays (e.g., VCSEL arrays) on a common substrate.

SUMMARY

In some implementations, a vertical cavity surface emitting laser (VCSEL) device includes a substrate layer and a first set of epitaxial layers for a bottom-emitting VCSEL disposed on the substrate layer, the first set of epitaxial layers including a first set of mirrors and at least one first active layer. The VCSEL device includes a second set of epitaxial layers for a top-emitting VCSEL disposed on the first set of epitaxial layers for the bottom-emitting VCSEL, the second set of epitaxial layers including a second set of mirrors and at least one second active layer. The top-emitting VCSEL and the bottom-emitting VCSEL are configured to emit light in opposite light emission directions.

In some implementations, a module includes a housing that includes an aperture and a VCSEL device attached to the housing. The VCSEL device includes a substrate layer and a first set of epitaxial layers for a bottom-emitting VCSEL disposed on the substrate layer, the first set of epitaxial layers including a first set of mirrors and at least one first active layer. The VCSEL device includes a second set of epitaxial layers for a top-emitting VCSEL disposed on the first set of epitaxial layers for the bottom-emitting VCSEL, the second set of epitaxial layers including a second set of mirrors and at least one second active layer. The top-emitting VCSEL and the bottom-emitting VCSEL are configured to emit light in opposite light emission directions, and a first emission area of the bottom-emitting VCSEL or a second emission area of the top-emitting VCSEL is aligned with the aperture of the housing.

In some implementations, a method includes growing, on a substrate, a first set of epitaxial layers for a bottom-emitting VCSEL, the first set of epitaxial layers including a first set of mirrors and at least one first active layer. The method includes growing, on the first set of epitaxial layers, a second set of epitaxial layers for a top-emitting VCSEL, the second set of epitaxial layers including a second set of mirrors and at least one second active layer. The method includes etching a portion of the second set of epitaxial layers until a surface of the first set of epitaxial layers is exposed. The top-emitting VCSEL and the bottom-emitting VCSEL are configured to emit light in opposite light emission directions.

BRIEF DESCRIPTION OF THE DRAWINGS

FIGS. 1A and 1B are diagrams depicting a top-view of an example emitter and a cross-sectional view of the example emitter along the line X-X, respectively.

DETAILED DESCRIPTION

Figure 2:
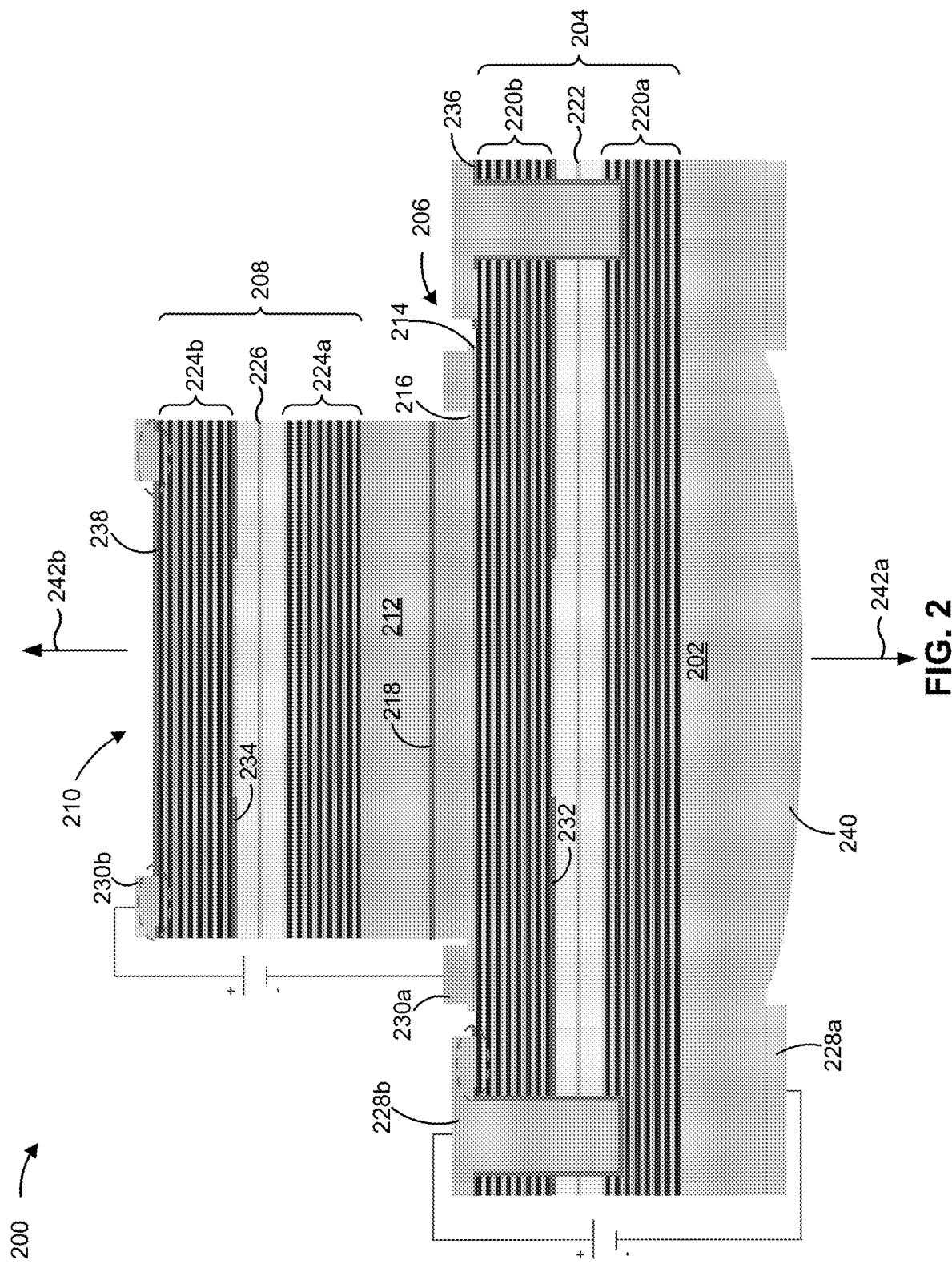
FIG. 2 is a diagram of an example vertical cavity surface emitting laser (VCSEL) device.

The following detailed description of example implementations refers to the accompanying drawings. The same reference numbers in different drawings may identify the same or similar elements.

A vertical cavity surface emitting laser (VCSEL) and an edge-emitting laser (EEL) emit light in different directions, which may be particularly relevant in applications requiring a small form factor. A VCSEL emits vertically in a direction perpendicular to a wafer surface. As such, a thickness of the VCSEL may be dictated by a quantity of layers of the VCSEL that are grown and an amount by which a substrate for the VCSEL is thinned during fabrication. An EEL emits from an edge of a device, parallel to a wafer surface. Moreover, a VCSEL may interface with external optics placed directly above the surface of the VCSEL. An EEL requires additional optics to change the direction of emitted light by 90 degrees if emission is to be in the same direction as the wafer surface.

Additionally, a VCSEL may emit light out of the top of a chip in a growth direction of the VCSEL (e.g., a top-emitting VCSEL) or down through a substrate through the back of the VCSEL (e.g., a bottom-emitting VCSEL). Each type of VCSEL may utilize a different epitaxial design and a different fabrication process. A top-emitting VCSEL may be easier to fabricate than a bottom-emitting VCSEL, but the top-emitting VCSEL may need to be used in combination with external optical components. A bottom-emitting VCSEL may integrate optical components onto the back of the substrate of the bottom-emitting VCSEL to reduce complexity, but a fabrication process of the bottom-emitting VCSEL may be more complex than a top-emitting VCSEL. A top-emitting VCSEL and/or a bottom-emitting VCSEL may be used in applications relating to dot projectors, indirect time of flight (iToF), direct time of flight (dToF), and/or light detection and ranging (LIDAR), among other examples.

In some cases, multiple VCSEL chips may be integrated into a device, such as a smartphone. For example, a first VCSEL chip, integrated into the device, may be configured to face a user (e.g., emit light in a direction of emission of a display of the device), which may be referred to as "front-facing." Continuing with the example, a second VCSEL chip, integrated into the device, may be configured to face the world (e.g., emit light opposite to a direction of emission of a display of the device), which may be referred to as "world-facing." Typically, both VCSEL chips that are used in such configurations may be top-emitting. Moreover, each VCSEL chip may be integrated into a separate module, thereby increasing overall device size and thickness.

Some implementations described herein provide a VCSEL device that emits light in opposite directions (e.g., bi-directionally). In some implementations, VCSELs of different types (e.g., top-emitting and bottom-emitting) may be integrated on a single chip. For example, both a top-emitting VCSEL and a bottom-emitting VCSEL (e.g., independent VCSELs with different active layers and mirrors) may be integrated into the same chip in a configuration that provides emission in opposite directions. In some implementations, a first set of epitaxial layers for one or more bottom-emitting VCSELs may be disposed on a substrate layer (e.g., a wafer), and a second set of epitaxial layers for one or more top-emitting VCSELs may be disposed on the first set of epitaxial layers. For example, multiple full VCSEL epitaxial stacks may be grown on the same substrate layer, and a lower VCSEL stack may be exposed during fabrication to produce multiple VCSELs that emit light in opposite light emission directions.

In this way, a single VCSEL module may include top-emitting and bottom-emitting VCSELs with a reduced form factor. Moreover, the VCSELs (e.g., which may be independently controlled) enable bi-directional emission of light to facilitate front-facing and world-facing operation. Thus, the front-facing and world-facing operation may be achieved without the need for separate VCSEL chips and modules, thereby reducing complexity, thickness, and overall form factor.

FIGS. 1A and 1B are diagrams depicting a top-view of an example emitter 100 and a cross-sectional view 150 of example emitter 100 along the line X-X, respectively. As shown in FIG. 1A, emitter 100 may include a set of emitter layers constructed in an emitter architecture. In some implementations, emitter 100 may correspond to one or more vertical-emitting devices described herein.

As shown in FIG. 1A, emitter 100 may include an implant protection layer 102 that is circular in shape in this example. In some implementations, implant protection layer 102 may have another shape, such as an elliptical shape, a polygonal shape, or the like. Implant protection layer 102 is defined based on a space between sections of implant material (not shown) included in emitter 100.

As shown by the medium gray and dark gray areas in FIG. 1A, emitter 100 includes an ohmic metal layer 104 (e.g., a P-Ohmic metal layer or an N-Ohmic metal layer) that is constructed in a partial ring-shape (e.g., with an inner radius and an outer radius). The medium gray area shows an area of ohmic metal layer 104 covered by a protective layer (e.g., a dielectric layer or a passivation layer) of emitter 100 and the dark gray area shows an area of ohmic metal layer 104 exposed by via 106, described below. As shown, ohmic metal layer 104 overlaps with implant protection layer 102. Such a configuration may be used, for example, in the case of a P-up/top-emitting emitter 100. In the case of a bottom-emitting emitter 100, the configuration may be adjusted as needed.

Not shown in FIG. 1A, emitter 100 includes a protective layer in which via 106 is formed (e.g., etched). The dark gray area shows an area of ohmic metal layer 104 that is exposed by via 106 (e.g., the shape of the dark gray area may be a result of the shape of via 106) while the medium grey area shows an area of ohmic metal layer 104 that is covered by some protective layer. The protective layer may cover all of the emitter other than the vias. As shown, via 106 is formed in a partial ring-shape (e.g., similar to ohmic metal layer 104) and is formed over ohmic metal layer 104 such that metallization on the protection layer contacts ohmic metal layer 104. In some implementations, via 106 and/or ohmic metal layer 104 may be formed in another shape, such as a full ring-shape or a split ring-shape.

As further shown, emitter 100 includes an optical aperture 108 in a portion of emitter 100 within the inner radius of the partial ring-shape of ohmic metal layer 104. Emitter 100 emits a laser beam via optical aperture 108. As further shown, emitter 100 also includes a current confinement aperture 110 (e.g., an oxide aperture formed by an oxidation layer of emitter 100 (not shown)). Current confinement aperture 110 is formed below optical aperture 108.

As further shown in FIG. 1A, emitter 100 includes a set of trenches 112 (e.g., oxidation trenches) that are spaced (e.g., equally, unequally) around a circumference of implant protection layer 102. How closely trenches 112 can be positioned relative to the optical aperture 108 is dependent on the application, and is typically limited by implant protection layer 102, ohmic metal layer 104, via 106, and manufacturing tolerances.

The number and arrangement of layers shown in FIG. 1A are provided as an example. In practice, emitter 100 may include additional layers, fewer layers, different layers, or differently arranged layers than those shown in FIG. 1A. For example, while emitter 100 includes a set of six trenches 112, in practice, other configurations are possible, such as a compact emitter that includes five trenches 112, seven trenches 112, or another quantity of trenches. In some implementations, trench 112 may encircle emitter 100 to form a mesa structure associated with a distance di. As another example, while emitter 100 is a circular emitter design, in practice, other designs may be used, such as a rectangular emitter, a hexagonal emitter, an elliptical emitter, or the like. Additionally, or alternatively, a set of layers (e.g., one or more layers) of emitter 100 may perform one or more functions described as being performed by another set of layers of emitter 100, respectively.

Notably, while the design of emitter 100 is described as including a VCSEL, other implementations are possible. For example, the design of emitter 100 may apply in the context of another type of optical device, such as a light emitting diode (LED), or another type of vertical emitting (e.g., top emitting or bottom emitting) optical device. Additionally, the design of emitter 100 may apply to emitters of any wavelength, power level, and/or emission profile. In other words, emitter 100 is not particular to an emitter with a given performance characteristic.

As shown in FIG. 1B, the example cross-sectional view may represent a cross-section of emitter 100 that passes through, or between, a pair of trenches 112 (e.g., as shown by the line labeled "X-X" in FIG. 1A). As shown, emitter 100 may include a backside cathode layer 128, a substrate layer 126, a bottom mirror 124, an active region 122, an oxidation layer 120, a top mirror 118, an implant isolation material 116, a protective layer 114 (e.g. a dielectric passivation/mirror layer), and an ohmic metal layer 104. As shown, emitter 100 may have, for example, a total height that is approximately 10 micrometers (μm).

Backside cathode layer 128 may include a layer that makes electrical contact with substrate layer 126. For example, backside cathode layer 128 may include an annealed metallization layer, such as an AuGeNi layer, a PdGeAu layer, or the like.

Substrate layer 126 may include a base substrate layer upon which epitaxial layers are grown. For example, substrate layer 126 may include a semiconductor layer, such as a GaAs layer, an InP layer, and/or another type of semiconductor layer.

Bottom mirror 124 may include a bottom reflector layer of emitter 100. For example, bottom mirror 124 may include a distributed Bragg reflector (DBR).

Active region 122 may include a layer that confines electrons and defines an emission wavelength of emitter 100. For example, active region 122 may be a quantum well.

Oxidation layer 120 may include an oxide layer that provides optical and electrical confinement of emitter 100. In some implementations, oxidation layer 120 may be formed as a result of wet oxidation of an epitaxial layer. For example, oxidation layer 120 may be an $Al_2O_3$ layer formed as a result of oxidation of an AlAs or AlGaAs layer. Trenches 112 may include openings that allow oxygen (e.g., dry oxygen, wet oxygen) to access the epitaxial layer from which oxidation layer 120 is formed.

Current confinement aperture 110 may include an optically active aperture defined by oxidation layer 120. A size of current confinement aperture 110 may range, for example, from approximately 4 μm to approximately 20 μm. In some implementations, a size of current confinement aperture 110 may depend on a distance between trenches 112 that surround emitter 100. For example, trenches 112 may be etched to expose the epitaxial layer from which oxidation layer 120 is formed. Here, before protective layer 114 is formed (e.g., deposited), oxidation of the epitaxial layer may occur for a particular distance (e.g., identified as do in FIG. 1B) toward a center of emitter 100, thereby forming oxidation layer 120 and current confinement aperture 110. In some implementations, current confinement aperture 110 may include an oxide aperture. Additionally, or alternatively, current confinement aperture 110 may include an aperture associated with another type of current confinement technique, such as an etched mesa, a region without ion implantation, lithographically defined intra-cavity mesa and regrowth, or the like.

Top mirror 118 may include a top reflector layer of emitter 100. For example, top mirror 118 may include a DBR.

Implant isolation material 116 may include a material that provides electrical isolation. For example, implant isolation material 116 may include an ion implanted material, such as a hydrogen/proton implanted material or a similar implanted element to reduce conductivity. In some implementations, implant isolation material 116 may define implant protection layer 102.

Protective layer 114 may include a layer that acts as a protective passivation layer and which may act as an additional DBR. For example, protective layer 114 may include one or more sub-layers (e.g., a dielectric passivation layer and/or a mirror layer, a $SiO_2$ layer, a $Si_3N_4$ layer, an $Al_2O_3$ layer, or other layers) deposited (e.g., by chemical vapor deposition, atomic layer deposition, or other techniques) on one or more other layers of emitter 100.

As shown, protective layer 114 may include one or more vias 106 that provide electrical access to ohmic metal layer 104. For example, via 106 may be formed as an etched portion of protective layer 114 or a lifted-off section of protective layer 114. Optical aperture 108 may include a portion of protective layer 114 over current confinement aperture 110 through which light may be emitted.

Ohmic metal layer 104 may include a layer that makes electrical contact through which electrical current may flow. For example, ohmic metal layer 104 may include a Ti and Au layer, a Ti and Pt layer and/or an Au layer, or the like, through which electrical current may flow (e.g., through a bondpad (not shown) that contacts ohmic metal layer 104 through via 106). Ohmic metal layer 104 may be P-ohmic, N-ohmic, or other forms known in the art. Selection of a particular type of ohmic metal layer 104 may depend on the architecture of the emitters and is within the knowledge of a person skilled in the art. Ohmic metal layer 104 may provide ohmic contact between a metal and a semiconductor and/or may provide a non-rectifying electrical junction and/or may provide a low-resistance contact. In some implementations, emitter 100 may be manufactured using a series of steps. For example, bottom mirror 124, active region 122, oxidation layer 120, and top mirror 118 may be epitaxially grown on substrate layer 126, after which ohmic metal layer 104 may be deposited on top mirror 118. Next, trenches 112 may be etched to expose oxidation layer 120 for oxidation. Implant isolation material 116 may be created via ion implantation, after which protective layer 114 may be deposited. Via 106 may be etched in protective layer 114 (e.g., to expose ohmic metal layer 104 for contact). Plating, seeding, and etching may be performed, after which substrate layer 126 may be thinned and/or lapped to a target thickness. Finally, backside cathode layer 128 may be deposited on a bottom side of substrate layer 126.

The number, arrangement, thicknesses, order, symmetry, or the like, of layers shown in FIG. 1B is provided as an example. In practice, emitter 100 may include additional layers, fewer layers, different layers, differently constructed layers, or differently arranged layers than those shown in FIG. 1B. Additionally, or alternatively, a set of layers (e.g., one or more layers) of emitter 100 may perform one or more functions described as being performed by another set of layers of emitter 100 and any layer may comprise more than one layer.

FIG. 2 is a diagram of an example VCSEL device 200. As shown in FIG. 2, the VCSEL device 200 may include a substrate layer 202, similarly as described above. In addition, the VCSEL device 200 may include a first set of epitaxial layers 204 for a bottom-emitting VCSEL 206 (e.g., one or more bottom-emitting VCSELs 206, such as a plurality of bottom-emitting VCSELs 206) disposed on the substrate layer 202, and the VCSEL device 200 may include a second set of epitaxial layers 208 for a top-emitting VCSEL 210 (e.g., one or more top-emitting VCSELs 210, such as a plurality of top-emitting VCSELs 210) disposed on the first set of epitaxial layers 204. The first set of epitaxial layers 204 and the second set of epitaxial layers may be independent, and thus the bottom-emitting VCSEL 206 and the top-emitting VCSEL 210 may be independent (e.g., electrically and optically). The first set of epitaxial layers 204 and/or the second set of epitaxial layers 208 may correspond to the emitter layers described in connection with FIGS. 1A-1B.

The VCSEL device 200 may include a bulk material layer 212 between the first set of epitaxial layers 204 and the second set of epitaxial layers 208. For example, the bulk material layer 212 may include a bulk semiconductor layer (e.g., GaAs), which may be lattice matched to the substrate layer 202 (e.g., the GaAs bulk semiconductor layer may be lattice matched to the GaAs substrate layer 202). In some implementations, the VCSEL device 200 may include an electrical isolation layer 214 (e.g., a semiconductor layer) between the first set of epitaxial layers 204 and the second set of epitaxial layers 208 (e.g., between the bulk material layer 212 and the first set of epitaxial layers 204). The electrical isolation layer 214 may include a material that provides electrical isolation. In some implementations, the VCSEL device 200 may include a contact layer 216 (e.g., a semiconductor layer) between the first set of epitaxial layers 204 and the second set of epitaxial layers 208 (e.g., between the bulk material layer 212 and the first set of epitaxial layers 204). The contact layer 216 may include a highly doped semiconductor material (e.g., an n++ material or a p++ material). The contact layer 216 may be disposed on the electrical isolation layer 214. In some implementations, the VCSEL device 200 may include a tunnel junction 218 between the first set of epitaxial layers 204 and one or more active layers, as described below, of the second set of epitaxial layers 208 (e.g., within the bulk material layer 212, within a bottom mirror of the second set of epitaxial layers 208, or the like, outside of the active regions of the bottom-emitting VCSEL 206 and the top-emitting VCSEL 210).

The tunnel junction 218 may flip a carrier type (e.g., from electrons (n-type) to holes (p-type)) between the first set of epitaxial layers 204 and the second set of epitaxial layers 208. In this way, the first set of epitaxial layers 204 and the second set of epitaxial layers 208 may both utilize a p-i-n structure and electrical driving scheme (e.g., to simplify manufacture of the VCSEL device 200). However, the first set of epitaxial layers 204 and the second set of epitaxial layers 208 are not limited to any particular structure. For example, the first set of epitaxial layers 204 and the second set of epitaxial layers 208 may include the same structure or different structures that may be any combination of p-i-n, n-i-p, n-p-i-n, or the like.

The first set of epitaxial layers 204 may include a first set of mirrors, shown as a first mirror 220a and a second mirror 220b. The first set of epitaxial layers 204 may include at least one first active layer 222 (e.g., a gain region) between the first mirror 220a and the second mirror 220b. The second set of epitaxial layers 208 may include a second set of mirrors, shown as a third mirror 224a and a fourth mirror 224b. The second set of epitaxial layers 208 may include at least one second active layer 226 (e.g., a gain region) between the third mirror 224a and the fourth mirror 224b. An active layer may include an active region where electrons and holes recombine to emit light. For example, an active region may include one or more quantum wells. An active layer may be located at a semiconductor junction of a set of epitaxial layers. A semiconductor junction may be a region at which oppositely-doped semiconductor material meets. For example, a first active layer and a second active layer of a set of epitaxial layers may be at a first p-n junction and a second p-n junction respectively. The bottom-emitting VCSEL 206 and/or the top-emitting VCSEL 210 may include two or more semiconductor junctions/active layers (e.g., the bottom-emitting VCSEL 206 and/or the top-emitting VCSEL 210 may be a multi junction VCSEL). Here, a tunnel junction may be between consecutive active layers. In some implementations, the first set of mirrors and the second set of mirrors may be configured to prevent optical crosstalk between the bottom-emitting VCSEL 206 and the top-emitting VCSEL 210.

In some implementations, the first set of mirrors may include the first mirror 220a (e.g., a bottom mirror) and the second mirror 220b (e.g., a top mirror), and the second set of mirrors may include the third mirror 224a (e.g., a bottom mirror) and the fourth mirror 224b (e.g., a top mirror). In some implementations, the first set of mirrors may include a first mirror (e.g., the first mirror 220a) and a second mirror (e.g., a combination of the second mirror 220b and the third mirror 224a), and the second set of mirrors may include the second mirror and a third mirror (e.g., the fourth mirror 224b). For example, the bulk material layer 212 may be omitted, and the top mirror (or one or more layers thereof) of the first set of epitaxial layers 204 may be combined with the bottom mirror (or one or more layers thereof) of the second set of epitaxial layers 208 to form a shared mirror for the first set of epitaxial layers 204 and the second set of epitaxial layers 208. The shared mirror may have increased reflectivity, thereby reducing optical leakage between the bottom-emitting VCSEL 206 and the top-emitting VCSEL 210. Moreover, use of the shared mirror may reduce a time and complexity of manufacturing the VCSEL device 200. The first mirror 220a, the second mirror 220b, the third mirror 224a, or the fourth mirror 224b may be DBRs, as described herein.

In some implementations, a first bottom mirror (e.g., the first mirror 220a) of the first set of mirrors and a second bottom mirror (e.g., the third mirror 224a) of the second set of mirrors may be one of n-type or p-type, and a first top mirror (e.g., the second mirror 220b) of the first set of mirrors and a second top mirror (e.g., the fourth mirror 224b) of the second set of mirrors may be the other of n-type or p-type. For example, the first bottom mirror and the second bottom mirror may be n-type, and the first top mirror and the second top mirror may be p-type. Here, as described above, the VCSEL device 200 may include the tunnel junction 218 between the first set of epitaxial layers 204 and the second set of epitaxial layers 208. Thus, the first set of epitaxial layers 204 and the second set of epitaxial layers 208 may both utilize the same p-i-n structure, the same n-i-p structure, or the like. In some implementations, the first set of epitaxial layers 204 and the second set of epitaxial layers 208 may utilize different structures, and the tunnel junction 218 may be omitted.

The at least one first active layer 222 may include one or more active layers, and the at least one second active layer 226 may include one or more active layers. In some implementations, a first quantity of active layers of the first active layer(s) 222 is the same as a second quantity of active layers of the second active layer(s) 226, as shown. In some implementations, the first quantity of active layers of the first active layer(s) 222 is different from the second quantity of active layers of the second active layer(s) 226. In this way, an optical power of the bottom-emitting VCSEL 206 may be the same as or different from an optical power of the top-emitting VCSEL 210. In implementations where the first active layer(s) 222 or the second active layer(s) 226 include multiple active layers (e.g., two active layers), the first set of epitaxial layers 204 or the second set of epitaxial layers 208, respectively, may include a tunnel junction (not shown) between the multiple active layers.

In an example, the bottom-emitting VCSEL 206 (or the top-emitting VCSEL 210) may have two active layers 222 (e.g., for higher slope efficiency) and may be suitable for applications that use higher power or longer distance light emission, while the top-emitting VCSEL 210 (or the bottom-emitting VCSEL) may have a single active layer 226 (e.g., for lower slope efficiency and/or for lower driver voltage and/or current operation) and may be suitable for applications that use lower power or shorter distance light emission. Thus, the VCSEL device 200 may be used for multi-power applications, such as indoor/outdoor applications, short range/long range applications, or the like. For example, if a world-facing application uses higher optical power, the world-facing VCSEL may include three active layers or five active layers, while the front-facing VCSEL may include a single active layer (e.g., because front-facing applications typically use lower optical power).

In some implementations, the bottom-emitting VCSEL 206 (e.g., the lower VCSEL) may have a greater quantity of active layers than the top-emitting VCSEL 210 (e.g., the upper VCSEL). Alternatively, the top-emitting VCSEL 210 may have a greater quantity of active layers than the bottom-emitting VCSEL 206. The VCSEL with the greatest quantity of active layers (e.g., and therefore the largest heat load) may be positioned nearest to the substrate layer 202, and thus nearest to a heat sink (not shown). The quantity of active layers that may be utilized in the bottom-emitting VCSEL 206 and the top-emitting VCSEL 210 is not limited to one or two active layers. For example, the bottom-emitting VCSEL 206 and/or the top-emitting VCSEL 210 may include three active layers, four active layers, five active layers, and/or six active layers, etc. Moreover, any combination of quantities of active layers may be used for the bottom-emitting VCSEL 206 and the top-emitting VCSEL 210 (e.g., because the first set of epitaxial layers 204 is independent of the second set of epitaxial layers 208).

The bottom-emitting VCSEL 206 and the top-emitting VCSEL 210 may be configured with an emission wavelength of 850 nanometers (nm), 905 nm, 940 nm, or greater than 1300 nm. In some implementations, an emission wavelength of the bottom-emitting VCSEL 206 may be the same as an emission wavelength of the top-emitting VCSEL 210. In some implementations, the emission wavelength of the bottom-emitting VCSEL 206 may be different from the emission wavelength of the top-emitting VCSEL 210. Here, the VCSEL device 200 may be used for multi-wavelength applications. For example, the VCSEL device 200 may provide shorter wavelength emission (e.g., 940 nm) and longer wavelength emission (e.g., greater than 1300 nm). In this way, the VCSEL device 200 may be used (e.g., simultaneously) for entirely different applications.

The VCSEL device 200 may include a first set of electrical contacts electrically connected to the first set of epitaxial layers 204. The first set of electrical contacts may include a bottom contact 228a (e.g., a cathode contact) and a top contact 228b (e.g., an anode contact). The bottom contact 228a may be disposed on a surface of the substrate layer 202 opposite the first set of epitaxial layers 204. The top contact 228b may be formed in one or more trenches that extend from a surface of the first set of epitaxial layers 204 to the first mirror 220a. The configuration for the first set of electrical contacts shown in FIG. 2 and described herein is provided as an example and other configurations are possible.

The VCSEL device 200 may include a second set of electrical contacts electrically connected to the second set of epitaxial layers 208. The second set of electrical contacts may include a bottom contact 230a (e.g., a cathode contact) and a top contact 230b (e.g., an anode contact). The bottom contact 230a may be disposed on the first set of epitaxial layers 204. For example, the bottom contact 230a may be disposed on the contact layer 216 or the electrical isolation layer 214. The top contact 230b may be disposed on a surface of the second set of epitaxial layers 208 (e.g., on the fourth mirror 224b) or may be formed in one or more trenches that extend from a surface of the second set of epitaxial layers 208 to the third mirror 224a. The configuration for the second set of electrical contacts shown in FIG. 2 and described herein is provided as an example and other configurations are possible.

The first set of electrical contacts and the second set of electrical contacts may be independent or connected together (e.g., depending on a driving scheme for the VCSEL device 200 that is employed). That is, the bottom-emitting VCSEL 206 and the top-emitting VCSEL 210 may be operated simultaneously or independently (e.g., based on a driving scheme that is employed and/or based on a manner in which the VCSELs are fabricated). For example, each VCSEL may be controlled independently by separate sets of contact layers that are deposited during fabrication of the VCSEL device 200.

In some implementations, the first set of epitaxial layers 204 may include an oxide layer 232 (e.g., between the first active layer(s) 222 and the second mirror 220b) that includes an oxide aperture, and the second set of epitaxial layers 208 may include an oxide layer 234 (e.g., between the second active layer(s) 226 and the fourth mirror 224b) that includes an oxide aperture, similarly as described above. In some implementations, an electrical isolation layer 236 may be disposed along a surface of the first set of epitaxial layers 204 (e.g., and line the one or more trenches for the top contact 230b), and an electrical isolation layer 238 may be disposed along a surface of the second set of epitaxial layers 208 (e.g., and line the one or more trenches, if present, for the top contact 232b). The electrical isolation layers 236, 238 may include portions of electrical isolation removal (shown by dashed ovals) to facilitate electrical connection of the top contacts 228b, 230b to the first set of epitaxial layers 204 and the second set of epitaxial layers 208, respectively.

In some implementations, a surface of the substrate layer 202, opposite the first set of epitaxial layers 204, may include an optical element 240 (e.g., a lens). That is, the optical element 240 may be integrated into the substrate layer 202. Here, the substrate layer 202 may have a thickness of greater than or equal to 50 µm (e.g., based on a configuration of the optical elements 240). As shown, the optical element 240 may be for the bottom-emitting VCSEL 206 (e.g., a light emission from the bottom-emitting VCSEL 206 may be directed at the optical element 240).

The bottom-emitting VCSEL 206 and the top-emitting VCSEL 210 may be configured to emit light in opposite light emission directions 242a, 242b (e.g., the light emission direction 242a is rotated 180 degrees relative to the light emission direction 242b). For example, as described herein, the bottom-emitting VCSEL 206 may be configured for bottom emission (e.g., through the substrate layer 202) and the top-emitting VCSEL 210 may be configured for top emission (e.g., away from the substrate layer 202). Moreover, the bottom-emitting VCSEL 206 and the top-emitting VCSEL 210 may be offset (e.g., vertically offset) in the opposite light emission directions 242a, 242b. For example, the second set of epitaxial layers 208 for the top-emitting VCSEL 210 may be stacked on the first set of epitaxial layers 204 for the bottom-emitting VCSEL 206.

In some implementations, the emission area of the bottom-emitting VCSEL 206 and the emission area of the top-emitting VCSEL 210 are aligned in a direction orthogonal to the opposite light emission directions 242a, 242b, as shown in FIG. 2. In some implementations, the emission area of the bottom-emitting VCSEL 206 and the emission area of the top-emitting VCSEL 210 are offset in the direction orthogonal to the opposite light emission directions 242a, 242b, as described below. That is, the emission area of the bottom-emitting VCSEL 206 and the emission area of the top-emitting VCSEL 210 may be horizontally offset.

In the VCSEL device 200, the bottom-emitting VCSEL 206 and the top-emitting VCSEL 210 are optically independent. In other words, there may be complete optical separation between an optical cavity of the bottom-emitting VCSEL 206 and an optical cavity of the top-emitting VCSEL 210, as optical leakage between the bottom-emitting VCSEL 206 and the top-emitting VCSEL 210 may affect the performance of the top-emitting VCSEL 210 (e.g., the VCSEL that is stacked on top of another VCSEL).

The VCSEL device 200 may be implemented as a single chip that includes the bi-directional VCSELs 206, 210. That is, the bi-directional VCSELs 206, 210 may share a single, common substrate layer 202 (e.g., a single, common wafer). Thus, the VCSEL device 200 provides integration of front-facing and world-facing VCSELs, which may be different optical powers (e.g., different quantities of active layers) and/or different emission wavelengths, in a single chip.

As indicated above, FIG. 2 is provided as an example. Other examples may differ from what is described with regard to FIG. 2.

Figure 3:
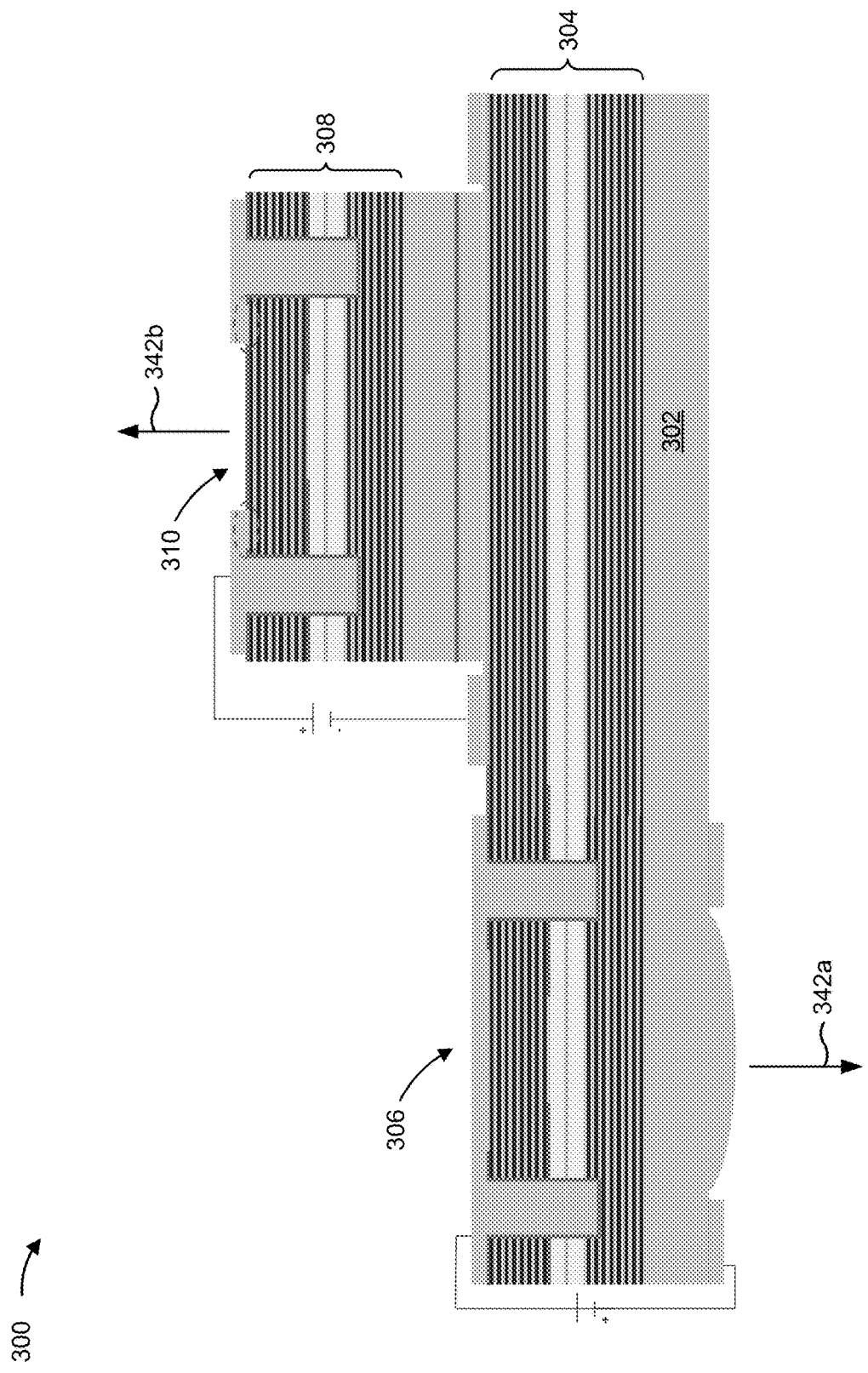
FIG. 3 is a diagram of an example VCSEL device.

FIG. 3 is a diagram of an example VCSEL device 300. The VCSEL device 300 may include a substrate layer 302, similarly as described above. In addition, the VCSEL device 300 may include a first set of epitaxial layers 304 for a bottom-emitting VCSEL 306 (e.g., one or more bottom-emitting VCSELs 306, such as a plurality of bottom-emitting VCSELs 306) disposed on the substrate layer 302, and the VCSEL device 300 may include a second set of epitaxial layers 308 for a top-emitting VCSEL 310 (e.g., one or more top-emitting VCSELs 310, such as a plurality of top-emitting VCSELs 310) disposed on the first set of epitaxial layers 304. The VCSEL device 300, including the first set of epitaxial layers 304 and the second set of epitaxial layers 308, may be configured in a similar manner as described in connection with the VCSEL device 200. The bottom-emitting VCSEL 306 and the top-emitting VCSEL 310 may be configured to emit light in opposite light emission directions 342a, 342b, in a similar manner as described above.

As shown in FIG. 3, an emission area of the bottom-emitting VCSEL 306 and an emission area of the top-emitting VCSEL 310 may be offset in the direction orthogonal to the opposite light emission directions 342a, 342b (e.g., the emission area of the bottom-emitting VCSEL 306 and the emission area of the top-emitting VCSEL 310 may be horizontally offset), as described herein. The horizontal offset may be useful for satisfying module constraints or for producing particular VCSEL array patterns (as described in connection with FIG. 4). For example, the VCSEL used for a front-facing application may require a dot projector with a randomized emitter layout, while the VCSEL used for a world-facing application, that is iToF-based, may require a uniform emitter array. The horizontal offset of the bottom-emitting VCSEL 306 and the top-emitting VCSEL 310 may also simplify fabrication of the VCSEL device 300.

As indicated above, FIG. 3 is provided as an example. Other examples may differ from what is described with regard to FIG. 3.

Figure 4:
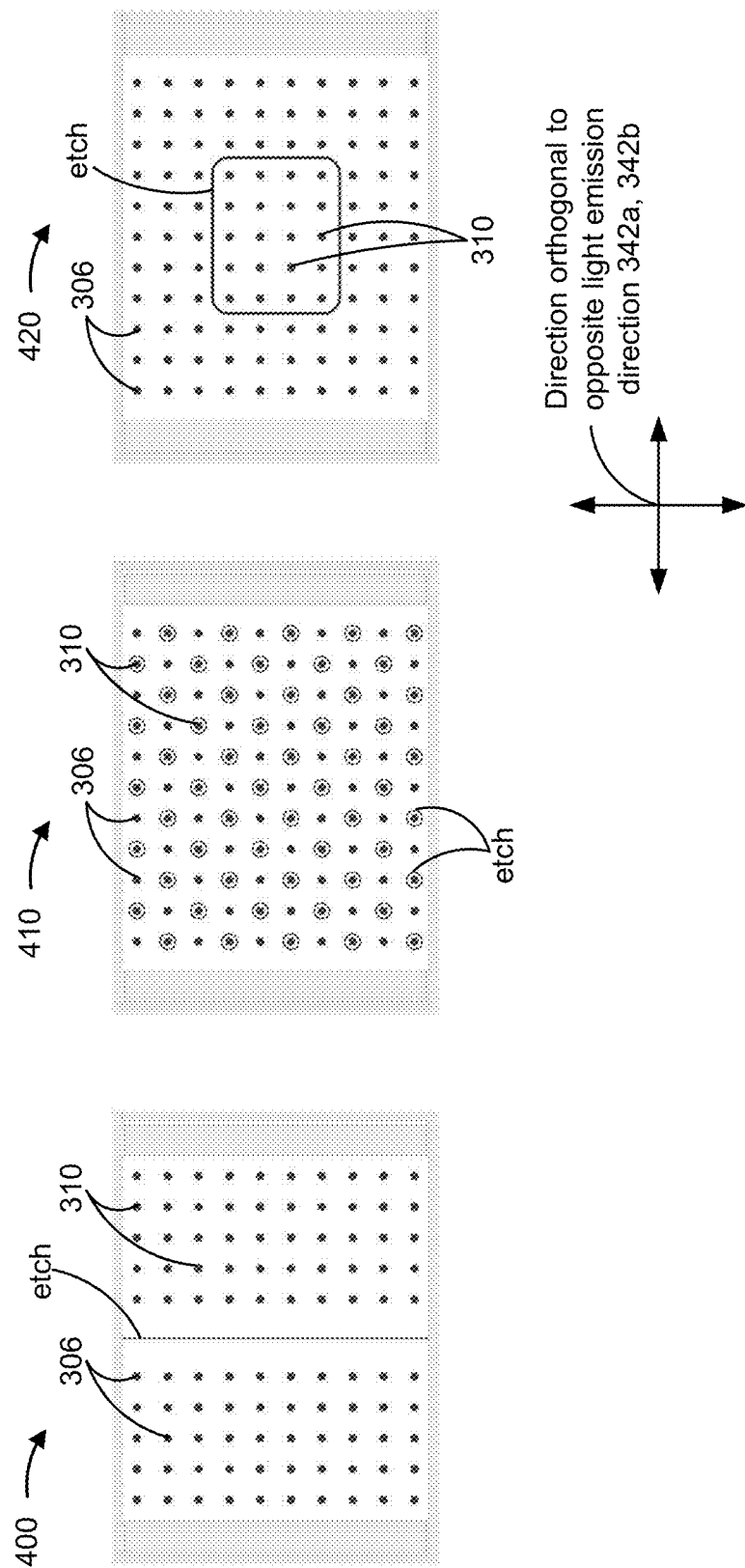
FIG. 4 is a diagram of example VCSEL arrays.

FIG. 4 is a diagram of example VCSEL arrays 400, 410, and 420. The VCSEL arrays 400, 410, and 420 may include the VCSEL device 300, or another VCSEL device described herein. For example, the VCSEL arrays 400, 410, and 420 may include the first set of epitaxial layers 304 for a plurality of bottom-emitting VCSELs 306 and the second set of epitaxial layers 308 for a plurality of the top-emitting VCSELs 310. As shown, the VCSEL arrays 400, 410, and 420 may be arranged into various patterns for the plurality of bottom-emitting VCSELs 306 and the plurality of top-emitting VCSELs 310 (some of which could not be achieved using separate VCSEL chips). The patterns shown in FIG. 4 are provided as examples, and in some implementations, a VCSEL array may utilize a pattern different from that shown in FIG. 4.

In the VCSEL array 400, the plurality of bottom-emitting VCSELs 306 and the plurality of top-emitting VCSELs 310 may be separated onto different sections of a chip (e.g., left and right sections, top and bottom sections, or the like). For example, the plurality of bottom-emitting VCSELs 306 may be positioned to a first side of a line that sections the VCSEL array 400 (e.g., into equal sections, or into unequal sections), and the plurality of top-emitting VCSELs 310 may be positioned to a second side of the line, in a direction orthogonal to the opposite light emission directions 342a, 342b. The line may represent a starting position of an etch of the second set of epitaxial layers 308 that exposes a surface of the first set of epitaxial layers 304.

In the VCSEL array 410 and in the VCSEL array 420, the plurality of bottom-emitting VCSELs 306 and the plurality of top-emitting VCSELs 310 are intermixed. For example, the plurality of bottom-emitting VCSELs 306 may be arranged in a first pattern, and the plurality of top-emitting VCSELs 310 may be arranged in a second pattern. In the VCSEL array 410, the plurality of bottom-emitting VCSELs 306 may be interleaved with the plurality of top-emitting VCSELs 310 in a uniform pattern (e.g., each row and each column of the VCSEL array 410 alternates between the plurality of bottom-emitting VCSELs 306 and the plurality of top-emitting VCSELs 310). However, in some implementations, the plurality of bottom-emitting VCSELs 306 are interleaved with the plurality of top-emitting VCSELs 310 in a random pattern or in a quasi-random pattern. In other words, the first pattern of the plurality of bottom-emitting VCSELs 306 is interleaved with the second pattern of the plurality of top-emitting VCSELs 310 in the direction orthogonal to the opposite light emission directions 242a, 242b. In the VCSEL array 410, etches of the second set of epitaxial layers 308 may expose (e.g., surround) individual VCSELs in the first set of epitaxial layers 304. In some implementations, the etches of the second set of epitaxial layers 308 may expose multiple VCSELs in the first set of epitaxial layers 304 (e.g., the etches expose particular sections of a surface of the first set of epitaxial layers 304).

In the VCSEL array 420, the plurality of bottom-emitting VCSELs 306 surround (e.g., centrally, as shown, or offset from center) the plurality of top-emitting VCSELs 310. In other words, the first pattern of the plurality of bottom-emitting VCSELs 306 surrounds the second pattern of the plurality of top-emitting VCSELs 310 in the direction orthogonal to the opposite light emission directions 342a, 342b. Here, an etch of the second set of epitaxial layers 308 may expose the plurality of bottom-emitting VCSELs 306 in the first set of epitaxial layers 304. In some implementations, the plurality of bottom-emitting VCSELs 306 may surround multiple groups of the plurality of top-emitting VCSELs 310. In some implementations, the plurality of top-emitting VCSELs 310 may surround the plurality of bottom-emitting VCSELs 306 in a similar manner.

In this way, a single optical component (e.g., that includes the VCSEL array 400, 410, or 420) may provide front-facing and world-facing light emission with reduced module size and module complexity.

As indicated above, FIG. 4 is provided as an example. Other examples may differ from what is described with regard to FIG. 4.

Figure 5:
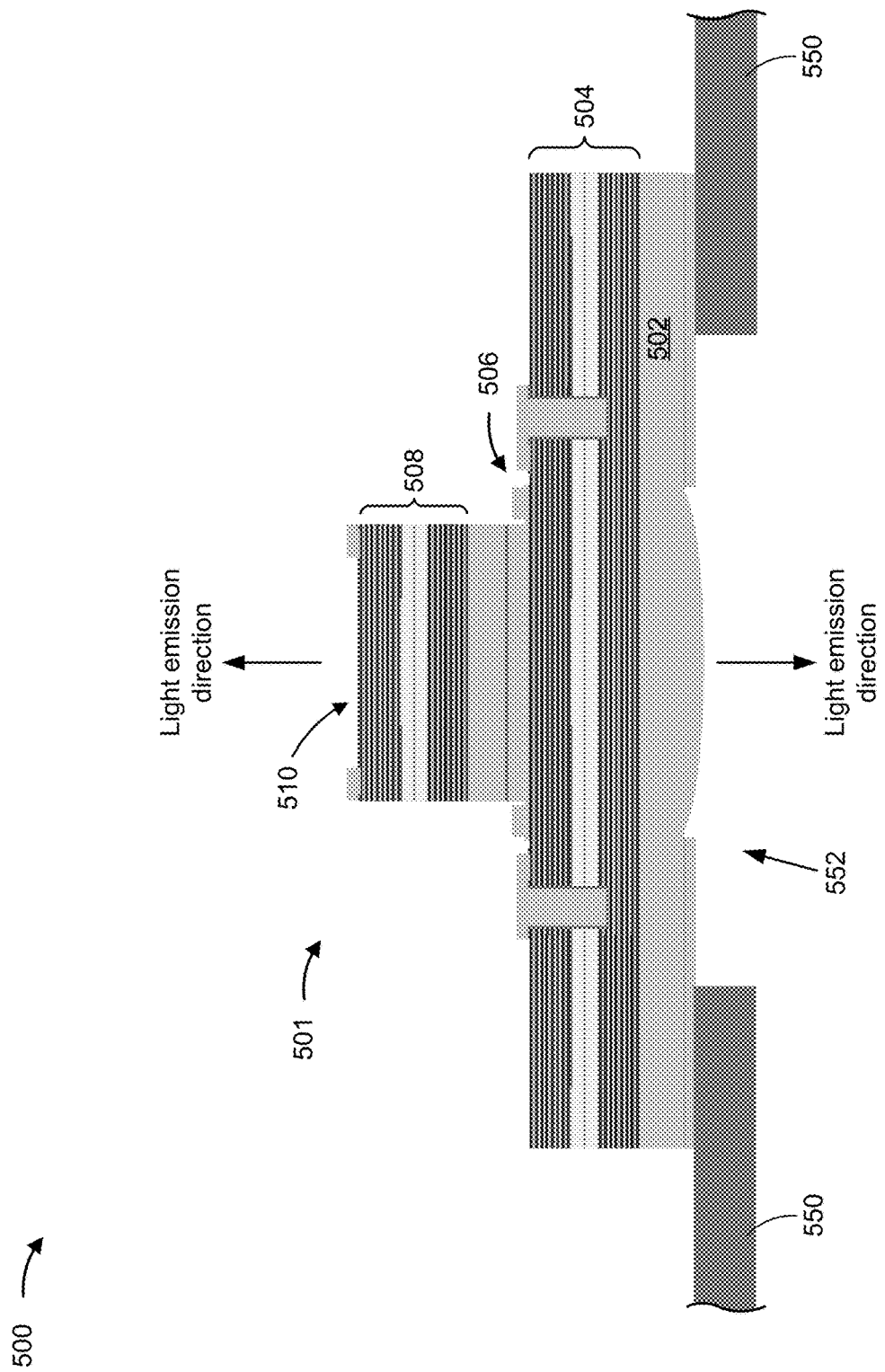
FIG. 5 is a diagram of an example VCSEL device.

FIG. 5 is a diagram of an example module 500. As shown in FIG. 5, the module may include a VCSEL device 501. The VCSEL device 501 may include a substrate layer 502, similarly as described above. In addition, the VCSEL device 501 may include a first set of epitaxial layers 504 for a bottom-emitting VCSEL 506 (e.g., one or more bottom-emitting VCSELs 506, such as a plurality of bottom-emitting VCSELs 506) disposed on the substrate layer 502, and the VCSEL device 501 may include a second set of epitaxial layers 508 for a top-emitting VCSEL 510 (e.g., one or more top-emitting VCSELs 510, such as a plurality of top-emitting VCSELs 510) disposed on the first set of epitaxial layers 504. The VCSEL device 501, including the first set of epitaxial layers 504 and the second set of epitaxial layers 508, may be configured in a similar manner as described in connection with the VCSEL device 200.

In addition, the module 500 may include a housing 550. The VCSEL device 501 may be attached to the housing 550. For example, the housing 550 may include a substrate to which the VCSEL device 501 is attached (e.g., at edges of the VCSEL device 501) by bonding, or the like. As an example, the housing 550 may include a box (e.g., where a base of the box is the substrate), a tray (e.g., where a base of the tray is the substrate), or a plate (e.g., where the plate is the substrate).

In some implementations, the housing 550 may include an aperture 552. That is, the substrate of the housing 550 may include the aperture 552. An emission area of the bottom-emitting VCSEL 506 or an emission area of the top-emitting VCSEL 510 may be aligned with the aperture 552 of the housing 550 (e.g., such that light emitted from the bottom-emitting VCSEL 506 or the top-emitting VCSEL 510 passes through the aperture 552). For example, the emission area of the bottom-emitting VCSEL 506 may be aligned with the aperture 552 of the housing 550 (e.g., such that the aperture surrounds the emission area of the bottom-emitting VCSEL 506, and light emitted from the bottom-emitting VCSEL 506 passes through the aperture 552), as shown.

In some implementations, the module 500 may include one or more optical elements (not shown) attached to the housing 550. For example, an optical element for the bottom-emitting VCSEL 506 may be attached to the substrate at a surface of the substrate opposite the VCSEL device 501. Here, the optical element may be attached to, or otherwise aligned with, the aperture 552. As another example, an optical element for the top-emitting VCSEL 510 may be attached to the housing above the VCSEL device 501.

As indicated above, FIG. 5 is provided as an example. Other examples may differ from what is described with regard to FIG. 5.

In some implementations, the VCSEL device 200, the VCSEL device 300, and/or the VCSEL device 501 may employ a type of vertically-emitting device other than a VCSEL, as described herein. In some implementations, a module may include the VCSEL device 200, the VCSEL device 300, and/or the VCSEL device 501. For example, the VCSEL device 200, the VCSEL device 300, and/or the VCSEL device 501 may be disposed in a housing with one or more additional electrical components (e.g., circuitry for driving the VCSEL device 200, the VCSEL device 300, and/or the VCSEL device 501) and/or optical components (e.g., optical elements, such as lenses, diffusers, diffractive optical elements, or the like). In some implementations, an optical source (e.g., for three-dimensional sensing (3 DS) or LIDAR) may include the VCSEL device 200, the VCSEL device 300, and/or the VCSEL device 501. In some implementations, an optical system may include the VCSEL device 200, the VCSEL device 300, and/or the VCSEL device 501. Moreover, the optical system may include one or more lenses, one or more optical elements (e.g., diffractive optical elements, refractive optical elements, or the like), one or more reflector elements, and/or one or more optical sensors, among other examples.

In some implementations, a VCSEL may achieve bi-directional light emission, as described herein, from the same active region. For example, reflectivities of the top mirror and the bottom mirror of the VCSEL may be configured such that light is emitted from both sides (e.g., the top and the bottom) of the VCSEL.

Figure 6:
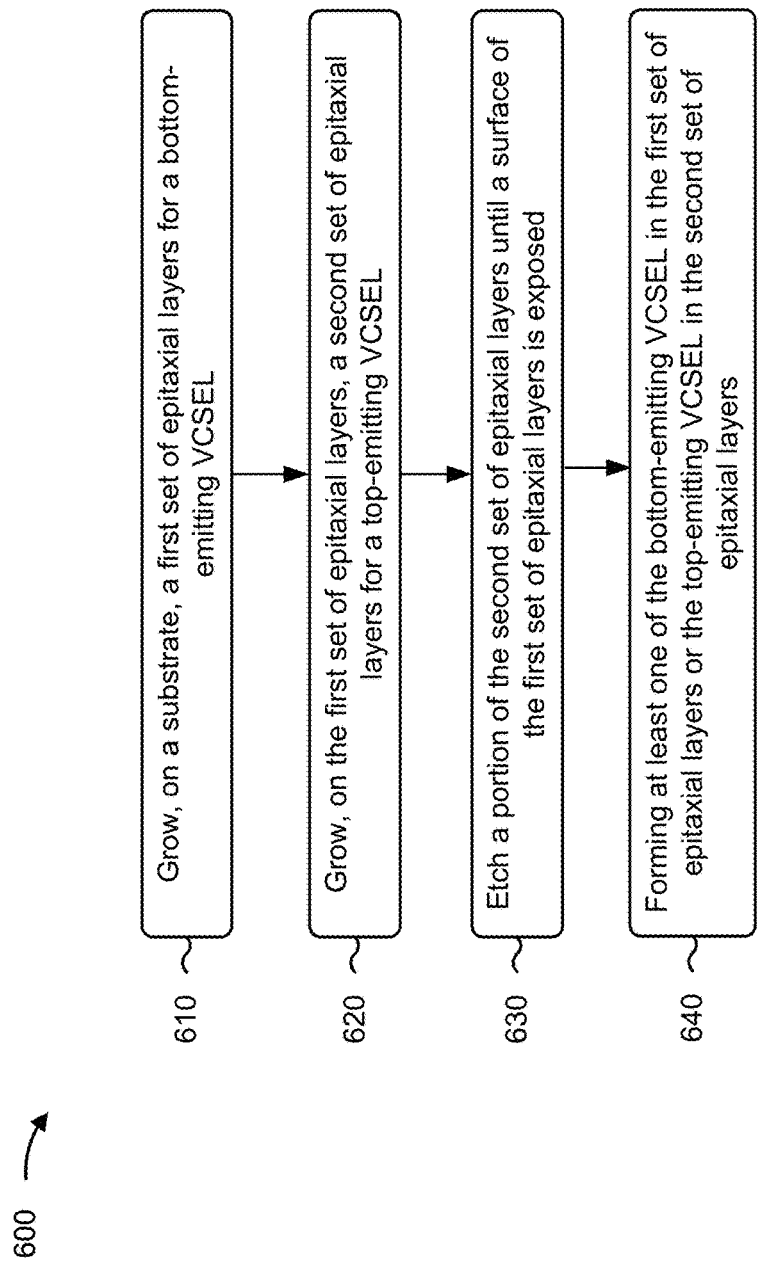
FIG. 6 is a flowchart of an example process for forming bi-directional VCSELs, as described herein.

FIG. 6 is a flowchart of an example process 600 for forming bi-directional VCSELs, as described herein.

As shown in FIG. 6, process 600 may include growing, on a substrate layer, a first set of epitaxial layers for a bottom-emitting VCSEL (e.g., a lower VCSEL) (block 610). The substrate layer may correspond to the substrate layer 202, 302, or 502. The first set of epitaxial layers may correspond to the first set of epitaxial layers 204, 304, or 504. As further shown in FIG. 6, process 600 may include growing, on the first set of epitaxial layers, a second set of epitaxial layers for a top-emitting VCSEL (e.g., an upper VCSEL) (block 620). The second set of epitaxial layers may correspond to the second set of epitaxial layers 208, 308, or 508. During growth in between respective sets of mirrors of the first set of epitaxial layers and the second set of epitaxial layers, limiting the epitaxial quality and thickness by the introduction of epitaxial dislocations or other strain effects should be avoided.

The first set of epitaxial layers and the second set of epitaxial layers may be grown during the same growth process on the same substrate layer. Moreover, the first set of epitaxial layers and the second set of epitaxial layers may be grown with different quantities of active layers and/or to emit light at different emission wavelengths. In some implementations, to configure different emission wavelengths for the first set of epitaxial layers and the second set of epitaxial layers, different growth processes may be used for the first set of epitaxial layers and the second set of epitaxial layers. For example, metal organic vapor phase epitaxy (MOVPE) and/or metal organic chemical vapor deposition (MOCVD) may be used to produce shorter wavelengths (e.g., 850 nm, 905 nm, and/or 940 nm), and molecular-beam epitaxy (MBE) may be used to produce longer wavelengths (e.g., greater than 1300 nm).

As further shown in FIG. 6, process 600 may include etching a portion of the second set of epitaxial layers until a surface of the first set of epitaxial layers is exposed (block 630). For example, to etch the portion of the second set of epitaxial layers, process 600 may include masking regions of the second set of epitaxial layers where operation (e.g., light emission) of the top-emitting VCSEL is desired and performing an etching process (e.g., wet etching, dry etching, or a combination thereof) to remove the second set of epitaxial layers in regions where operation (e.g., light emission) of the bottom-emitting VCSEL is desired. In some implementations, the second set of epitaxial layers may be etched to produce the pattern of VCSEL array 400, the pattern of VCSEL array 410, and/or the pattern of VCSEL array 420, among other examples.

As further shown in FIG. 6, process 600 may include forming at least one of the bottom-emitting VCSEL in the first set of epitaxial layers or the top-emitting VCSEL in the second set of epitaxial layers (block 640). Forming the bottom-emitting VCSEL and/or the top-emitting VCSEL may include depositing metal contacts for the bottom-emitting VCSEL and/or the top-emitting VCSEL, exposing an oxidation layer of the bottom-emitting VCSEL and/or the top-emitting VCSEL, or the like. In some implementations, the bottom-emitting VCSEL and the top-emitting VCSEL both may be formed after the etching described in connection with block 630. In some implementations, the top-emitting VCSEL may be formed prior to the etching described in connection with block 630, and the bottom-emitting VCSEL may be formed after the etching described in connection with block 630.

In some implementations, the bottom-emitting VCSEL and the top-emitting VCSEL may be formed independently. For example, the bottom-emitting VCSEL may be formed by masking regions of the VCSEL device other than a region for the bottom-emitting VCSEL, and the top-emitting VCSEL may be formed by masking regions of the VCSEL device other than a region for the top-emitting VCSEL. In some implementations, the bottom-emitting VCSEL and the top-emitting VCSEL may be formed simultaneously, for example, by simultaneously depositing respective metal contacts for each VCSEL and/or by simultaneously exposing respective oxidation layers of each VCSEL.

In this way, process 600 improves tolerances of the VCSEL device and eliminates the need for multiple wafers and/or multiple growth runs to produce a VCSEL device that is suitable for bi-directional light emission.

Process 600 may include additional implementations, such as any single implementation or any combination of implementations described below and/or in connection with one or more other processes described elsewhere herein.

Although FIG. 6 shows example blocks of process 600, in some implementations, process 600 includes additional blocks, fewer blocks, different blocks, or differently arranged blocks than those depicted in FIG. 6. Additionally, or alternatively, two or more of the blocks of process 600 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A vertical cavity surface emitting laser (VCSEL) device, comprising:
 a substrate layer;
 a first set of epitaxial layers for a bottom-emitting VCSEL disposed on the substrate layer, the first set of epitaxial layers comprising:
  a first set of mirrors; and
  at least one first active layer; and
 a second set of epitaxial layers for a top-emitting VCSEL disposed on the first set of epitaxial layers for the bottom-emitting VCSEL, the second set of epitaxial layers comprising:
  a second set of mirrors; and
  at least one second active layer,
  wherein the top-emitting VCSEL and the bottom-emitting VCSEL are configured to emit light in opposite light emission directions.

2. The VCSEL device of claim 1, further comprising at least one of:
 an electrical isolation layer between the first set of epitaxial layers and the second set of epitaxial layers;
 a contact layer between the first set of epitaxial layers and the second set of epitaxial layers; or
 a tunnel junction between the first set of epitaxial layers and the at least one second active layer.

3. The VCSEL device of claim 1, further comprising:
 a bulk material layer between the first set of epitaxial layers and the second set of epitaxial layers.

4. The VCSEL device of claim 1, wherein the first set of mirrors comprises a first mirror and a second mirror, and
 wherein the second set of mirrors comprises the second mirror and a third mirror.

5. The VCSEL device of claim 1, wherein a surface of the substrate layer opposite the first set of epitaxial layers comprises an optical element for the bottom-emitting VCSEL.

6. The VCSEL device of claim 1, wherein a first emission area of the bottom-emitting VCSEL and a second emission area of the top-emitting VCSEL are offset in a direction orthogonal to the opposite light emission directions.

7. The VCSEL device of claim 1, wherein a first emission area of the bottom-emitting VCSEL and a second emission area of the top-emitting VCSEL are aligned in a direction orthogonal to the opposite light emission directions.

8. The VCSEL device of claim 1, wherein a first quantity of active layers of the at least one first active layer is different from a second quantity of active layers of the at least one second active layer.

9. The VCSEL device of claim 1, wherein a first emission wavelength of the bottom-emitting VCSEL is different from a second emission wavelength of the top-emitting VCSEL.

10. A module, comprising:
   a housing that includes an aperture; and
   a vertical cavity surface emitting laser (VCSEL) device attached to the housing, the VCSEL device comprising:
      a substrate layer;
      a first set of epitaxial layers for a bottom-emitting VCSEL disposed on the substrate layer, the first set of epitaxial layers comprising:
         a first set of mirrors; and
         at least one first active layer; and
      a second set of epitaxial layers for a top-emitting VCSEL disposed on the first set of epitaxial layers for the bottom-emitting VCSEL, the second set of epitaxial layers comprising:
         a second set of mirrors; and
         at least one second active layer,
      wherein the top-emitting VCSEL and the bottom-emitting VCSEL are configured to emit light in opposite light emission directions, and
      wherein a first emission area of the bottom-emitting VCSEL or a second emission area of the top-emitting VCSEL is aligned with the aperture of the housing.

11. The module of claim 10, wherein the first emission area of the bottom-emitting VCSEL is aligned with the aperture of the housing.

12. The module of claim 10, wherein a surface of the substrate layer opposite the first set of epitaxial layers comprises an optical element for the bottom-emitting VCSEL.

13. The module of claim 10, further comprising:
   at least one optical element for the top-emitting VCSEL.

14. The module of claim 10, wherein a first bottom mirror of the first set of mirrors and a second bottom mirror of the second set of mirrors are one of n-type or p-type,
   wherein a first top mirror of the first set of mirrors and a second top mirror of the second set of mirrors are the other of n-type or p-type, and
   wherein a tunnel junction is between the first set of epitaxial layers and the at least one second active layer.

15. The module of claim 10, wherein the first emission area of the bottom-emitting VCSEL and the second emission area of the top-emitting VCSEL are aligned in a direction orthogonal to the opposite light emission directions.

16. The module of claim 10, wherein a first quantity of active layers of the at least one first active layer is different from a second quantity of active layers of the at least one second active layer.

17. The module of claim 10, wherein a first emission wavelength of the bottom-emitting VCSEL is different from a second emission wavelength of the top-emitting VCSEL.

18. The module of claim 10, wherein the VCSEL device further comprises at least one of:
   an electrical isolation layer between the first set of epitaxial layers and the second set of epitaxial layers;
   a contact layer between the first set of epitaxial layers and the second set of epitaxial layers; or
   a tunnel junction between the first set of epitaxial layers and the at least one second active layer.

19. The module of claim 10, wherein the VCSEL device further comprises:
   a bulk material layer between the first set of epitaxial layers and the second set of epitaxial layers.

20. The module of claim 10, wherein the first set of mirrors comprises a first mirror and a second mirror, and
   wherein the second set of mirrors comprises the second mirror and a third mirror.

* * * * *